(12) United States Patent
Mikasa

(10) Patent No.: US 7,700,456 B2
(45) Date of Patent: Apr. 20, 2010

(54) SEMICONDUCTOR DEVICE AND MANUFACTURING METHOD OF THE SAME

(75) Inventor: Noriaki Mikasa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 99 days.

(21) Appl. No.: 11/872,794

(22) Filed: Oct. 16, 2007

(65) Prior Publication Data

US 2008/0157206 A1 Jul. 3, 2008

(30) Foreign Application Priority Data

Oct. 16, 2006 (JP) ............................. 2006-281150

(51) Int. Cl.
*H01L 21/00* (2006.01)
(52) U.S. Cl. .................. 438/424; 438/284; 438/399
(58) Field of Classification Search .............. 438/424, 438/284, 399
See application file for complete search history.

(56) References Cited

U.S. PATENT DOCUMENTS

| | | | |
|---|---|---|---|
| 6,291,891 B1 * | 9/2001 | Higashi et al. | 257/774 |
| 6,368,951 B2 * | 4/2002 | Higashi et al. | 438/618 |
| 7,087,950 B2 * | 8/2006 | Willer et al. | 257/314 |
| 7,129,550 B2 * | 10/2006 | Fujiwara et al. | 257/401 |
| 7,348,246 B2 * | 3/2008 | Kim et al. | 438/284 |
| 7,394,116 B2 * | 7/2008 | Kim et al. | 257/213 |
| 7,442,987 B2 * | 10/2008 | Kim et al. | 257/316 |
| 2005/0051825 A1 * | 3/2005 | Fujiwara et al. | 257/308 |
| 2005/0285204 A1 * | 12/2005 | Kim et al. | 257/368 |
| 2006/0097310 A1 * | 5/2006 | Kim et al. | 257/321 |
| 2006/0166456 A1 * | 7/2006 | Fujiwara et al. | 438/399 |
| 2006/0177977 A1 * | 8/2006 | Chan et al. | 438/238 |
| 2008/0054374 A1 * | 3/2008 | Mikasa | 257/401 |
| 2008/0128792 A1 * | 6/2008 | Kim et al. | 257/326 |
| 2008/0142881 A1 * | 6/2008 | Mikasa | 257/330 |
| 2008/0157206 A1 * | 7/2008 | Mikasa | 257/365 |
| 2008/0164522 A1 * | 7/2008 | Mikasa | 257/345 |
| 2008/0296667 A1 * | 12/2008 | Mikasa | 257/327 |
| 2009/0090949 A1 * | 4/2009 | Mikasa | 257/296 |

FOREIGN PATENT DOCUMENTS

| | | |
|---|---|---|
| JP | 5-198817 | 8/1993 |
| JP | 2004-531085 | 10/2004 |
| JP | 2005-572963 | 3/2005 |
| JP | 2005-294789 | 10/2005 |
| JP | 200613521 | 1/2006 |
| JP | 2006-135067 | 5/2006 |
| JP | 2006-196617 | 7/2006 |
| WO | 03/001604 | 1/2003 |

OTHER PUBLICATIONS

Japanese Patent Office issued a Japanese Office Action dated Apr. 1, 2009, Application No. 2006-281150.

* cited by examiner

*Primary Examiner*—Laura M Menz
(74) *Attorney, Agent, or Firm*—Young & Thompson

(57) ABSTRACT

A manufacturing method of a semiconductor device includes a step of defining an element region by etching a semiconductor substrate using a first dielectric film as a mask, a step of reducing the first dielectric film by isotropic etching, a step of forming a side wall on a side surface of the reduced first dielectric film, a step of removing the first dielectric film, and a step of forming a trench in the element region by etching using the side wall as a mask to form a plurality of fin portions at the element region.

6 Claims, 16 Drawing Sheets

SEMICONDUCTOR DEVICE AND MANUFACTURING METHOD OF THE SAME

This application is based upon and claims the benefit of priority from Japanese application No. 2006-281150, filed on Oct. 16, 2006, the disclosure of which is incorporated herein in its entirety by reference.

BACKGROUND OF THE INVENTION

This invention relates to a semiconductor device, in particular, to a semiconductor device having a plurality of fin diffused regions at a channel portion and to a manufacturing method thereof.

A related semiconductor device employing a multi channel fin structure is manufactured by the following steps.

At first, a hard mask is formed on a substrate and then it is patterned into a shape corresponding to an active region by photolithography.

Next, the substrate is etched by use of the patterned hard mask to define the active region.

Subsequently, the hard mask is reduced (or minified) by means of isotropic etching.

Then, a first dielectric film is formed to fill an element isolation region and embed the hard mask.

Next, the first dielectric film is planarized and polished using chemical mechanical polishing (CMP) while a surface of the hard mask is used as a planarization end point.

Next, the first dielectric film and the hard mask are patterned to form a dummy gate pattern by photolithography.

Then, a second dielectric film is formed to embed the dummy gate pattern. The second dielectric film is planarized using the CMP while the surface of the hard mask is used as a planarization end point.

After the hard mask is selectively removed, the substrate is etched using the first and the second dielectric films as a mask to form a central trench.

Next, the first and the second dielectric films are partly removed to align a surface position of them with a bottom position of the central trench.

Subsequently, a gate film and a gate conductive layer are formed. The gate conductive layer is patterned by the photolithography to form a gate electrode.

As mentioned above, the related semiconductor device employing the multi channel fin structure is manufactured. Such a method is disclosed in Japanese Laid-Open Patent Publication No. 2006-13521.

On the other hand, it is known as another related method to form a multi channel fin structure by use of side walls. Such a method is disclosed in Japanese Laid-Open Patent Publication No. 2006-196617.

SUMMARY OF THE INVENTION

In the related method for manufacturing the related semiconductor device employing the multi channel fin structure, as mentioned above, it is necessary to perform both of the photolithography and the planarization (or CMP) twice to form the multi channel fin structure. Therefore, the related method has a problem of complexity.

In the related method, the dummy gate pattern is designed to be identical to the gate electrode regarding width. Accordingly, the gate electrode must be formed so that it is exactly positioned at the position where the dummy gate pattern was formerly formed. Thus, the related method has disadvantage that high accuracy of positioning is necessary. If the gate electrode is not in the right position, the width of the gate electrode varies. This is because it is very difficult to remove materials of the gate electrode embedded in the central trench even if the etching is carried out. Furthermore, this is because there is apprehension about that an undesirable channel is formed in the outside of the fin portions and deteriorates electric characteristics.

Here, it is assumed that the width of the dummy gate (i.e. the width of the central trench) is made smaller than that of the gate electrode so that high accuracy of positioning becomes unnecessary. In such a case, as illustrated in FIG. 1, an interval D32 or D33 between each side of a gate electrode 32, which is formed across an element region 31, and a corresponding edge of a central trench 33 must be larger than a predetermined distance. For example, when the width D31 of the gate electrode 32 is equal to 60 nm and the central trench 33 has margins of 20 nm (=D32=D33) at left and right sides thereof, the length of the central trench 33 is equal to 20 nm (=60−20−20). The length of the central trench is equal to that of fins which are used as channel portions. The length of the fins is remarkably limited in comparison with the width of the gate electrode. In this structure, there is a current path Path3 which passes below the central trench 33 as well as current paths Path1 and Path 2 which pass through two fins as current paths between a source S and a drain D. As illustrated in FIG. 2, the current path Path3 is longer than each of the current paths Path1 and Path 2 by length of D34×2. Thus, the semiconductor device has transistor parts which have different threshold values and thereby has bad response characteristics.

On the other hand, in the other related method using the side walls, the side walls is formed on side surfaces of a polycrystalline silicon film which is formed in thin line shape by means of photolithography. Accordingly, interval between fins which are formed by the use of the side walls depends on the width of the thin line shaped polycrystalline silicon film. Namely, the interval between the fins depends on resolution of the photolithography. Thus, the multi channel fin structure formed by the other related method using side walls has disadvantage that the interval between fins is relatively large.

Therefore, this invention aims to provide a simplified manufacturing method of a semiconductor device.

Further, this invention aims to provide a semiconductor device having an interval independent of resolution of photolithography between fins thereof and thereby having stable electric characteristics and to provide a manufacturing method thereof.

According to an aspect of this invention, a semiconductor device includes an element region defined by etching a semiconductor substrate using a dielectric film as an etching mask. A plurality of fin portions is formed by etching the element region using a side wall as an etching mask. The side wall is formed on a side surface of a reduced dielectric film formed by reducing the dielectric film.

In the semiconductor device, length of the fin portions may be larger than width of a gate electrode formed to be perpendicular to the fin portions.

According to another aspect of this invention, a method for manufacturing a semiconductor device includes steps of defining an element region by etching a semiconductor substrate using a first dielectric film as a mask; reducing the first dielectric film by isotropic etching to form a reduced dielectric film; forming a side wall on a side surface of the reduced dielectric film; removing the reduced dielectric film; and forming a trench in the element region by etching using the side wall as a mask to form a plurality of fin portions at the element region.

The method further includes steps of filling a periphery of the element region with a second dielectric film after the defining step; planarizing the second dielectric film; and aligning a surface of the second dielectric film with a surface of the element region.

DESCRIPTION OF THE PREFERRED EMBODIMENTS

Preferred embodiments of the present invention will be described with reference to the accompanying drawings.

FIGS. 3 to 19 are sectional or plane views showing processes of a manufacturing method of a semiconductor device according to a first embodiment of this invention.

Figure 1:
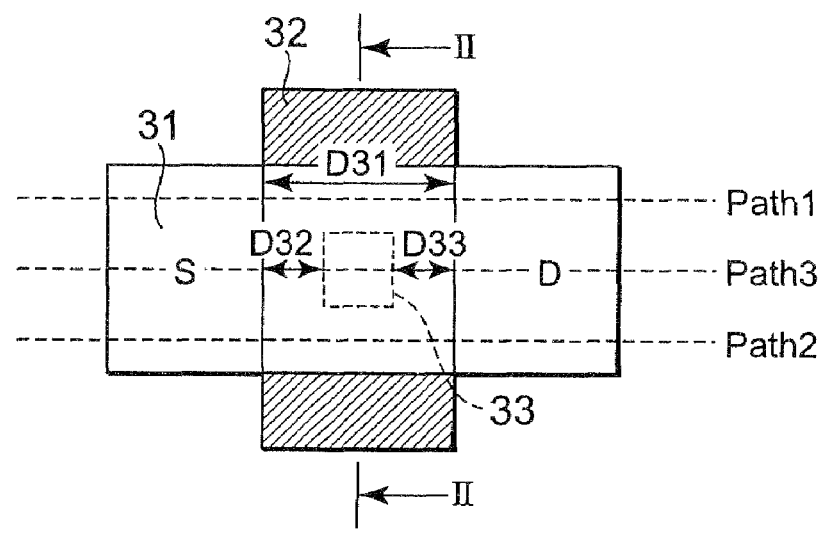
FIG. 1 is a plane view for describing a problem in a related semiconductor device.
Figure 2:
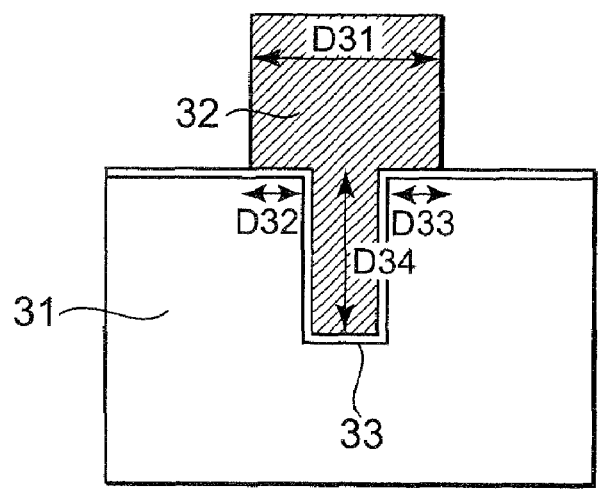
FIG. 2 is a sectional view taken along a II-II line of FIG. 1.
Figure 3:
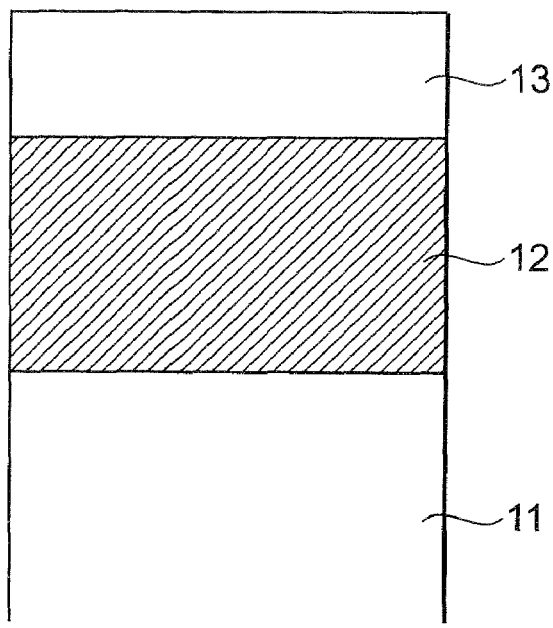
FIG. 3 is a sectional view for describing a manufacturing method of a semiconductor device according to a first embodiment of this invention.

At first, as illustrated in FIG. 3, on a silicon substrate 11, a first dielectric film (e.g. a nitride film) 12 is formed, and a photo resist film 13 is formed on the first dielectric film 12.

Figure 4:
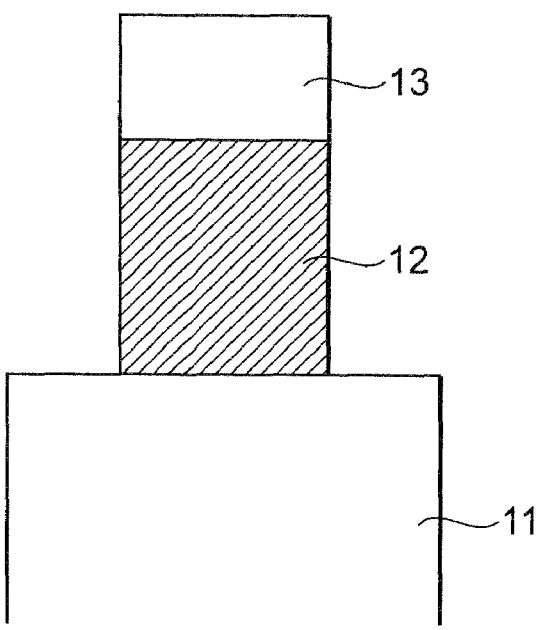
FIG. 4 is a sectional view for describing a following step following the step of FIG. 3.

Next, the photo resist film 13 is patterned into a diffusion layer pattern (or an element region pattern) using the photolithography technique. Using the patterned photo resist film 13 as an etching mask, the first dielectric film 12 is etched (or patterned) as shown in FIG. 4.

Figure 5:
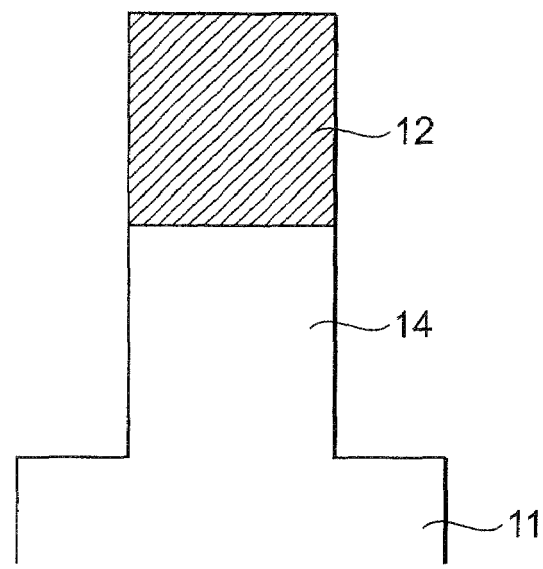
FIG. 5 is a sectional view for describing a following step following the step of FIG. 4.

Next, the photo resist film 13 is removed. Using the first dielectric film 12 as an etching mask, the semiconductor substrate 11 is etched by dry (or anisotropic) etching to delimit a diffusion layer (or an element region) 14 as shown in FIG. 5.

Figure 6:
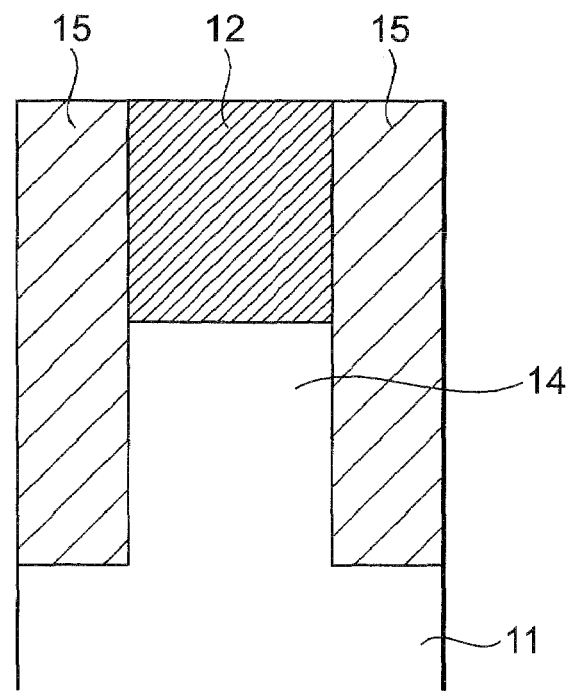
FIG. 6 is a sectional view for describing a following step following the step of FIG. 5.

Next, a second dielectric film (e.g. an oxide film) 15 which is different from the first dielectric film 12 is formed on an entire surface to embed the diffusion layer 14 (or to fill a gap between the diffusion layer 14 and other diffusion layers (not shown)). Then, using the first dielectric film 12 as a stopper, a chemical mechanical polishing (CMP) is executed to the second dielectric film 15. Hereby, a surface of the second dielectric film 15 is planarized and aligned with an upper surface of the first dielectric film 12 as shown in FIG. 6. Note that the second dielectric film 15 must have an etching selectivity (or a high etching rate) to the first dielectric film 12 on an occasion of dry or wet etching.

Figure 7:
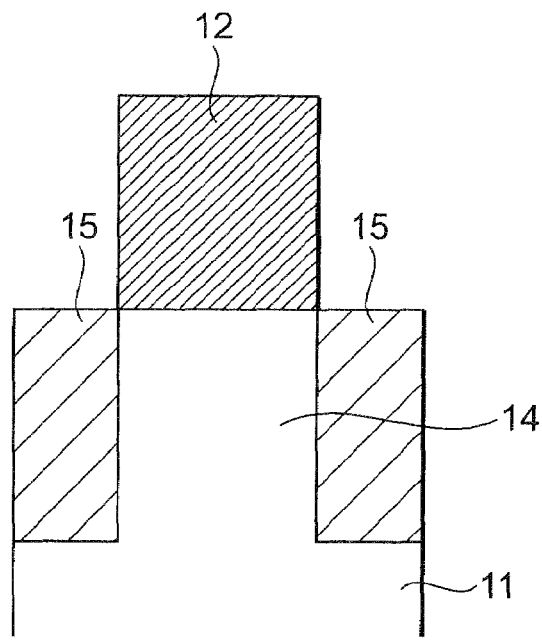
FIG. 7 is a sectional view for describing a following step following the step of FIG. 6.

Subsequently, as illustrated in FIG. 7, the second dielectric film 15 is etched by wet etching to align the upper surface of the second dielectric film 15 with that of the silicon substrate 11 (or the diffusion layer 14).

Figure 8:
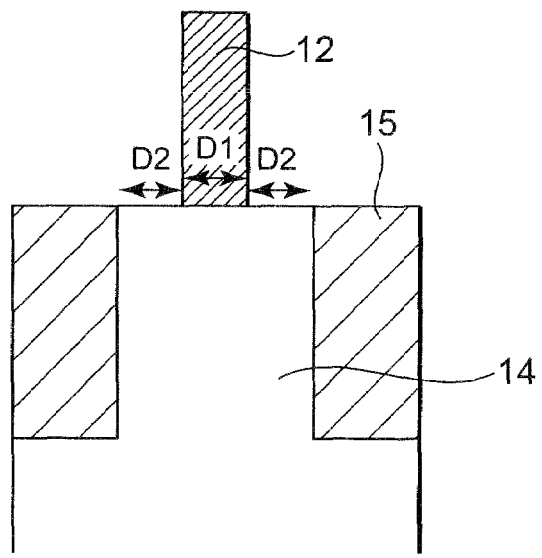
FIG. 8 is a sectional view for describing a following step following the step of FIG. 7.
Figure 9:
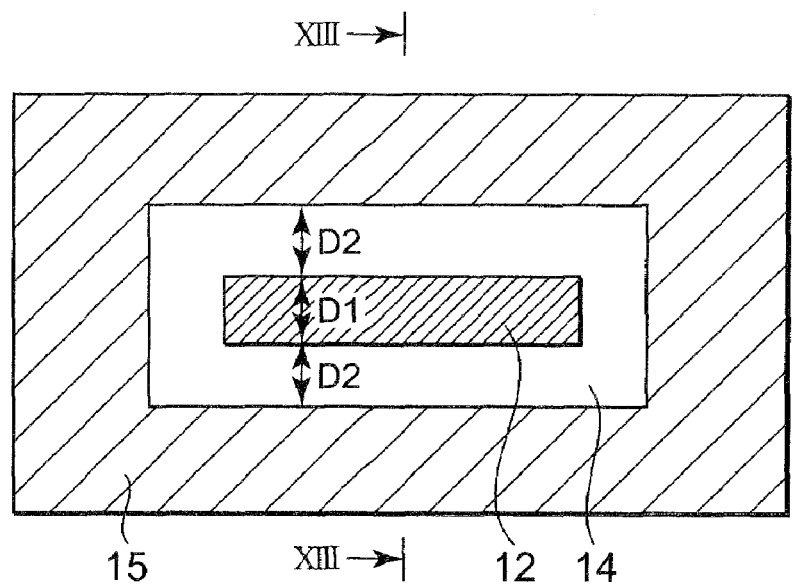
FIG. 9 is a plane view corresponding to FIG. 8.

Next, the first dielectric film 12 is reduced in size by wet (or isotropic) etching. Consequently, the width of the first dielectric film 12 is equal to D1 as shown in FIG. 8 while the side surfaces of the first dielectric film 12 are located at a distance D2 from the side surfaces of the diffusion layer 14. FIG. 9 is a plane view corresponding to FIG. 8. A sectional view taken along a XIII-XIII line of FIG. 9 corresponds to FIG. 8 (Hereinafter, relation between other sectional views and corresponding plane views are similar.)

The width D1 of the first dielectric film 12 is determined by size prior to reduction thereof (or size of the diffusion layer 14) and etching conditions of the isotropic etching for the first dielectric film 12. The width D1 can be reduced smaller than the resolution of the photolithography or than, for example, 30 nm.

The distance D2 is also determined by the etching conditions of the isotropic etching for the first dielectric film 12 and can be reduced, for example, smaller than 30 nm. Additionally, the distance D2 defines width of fin portions formed later.

Figure 10:
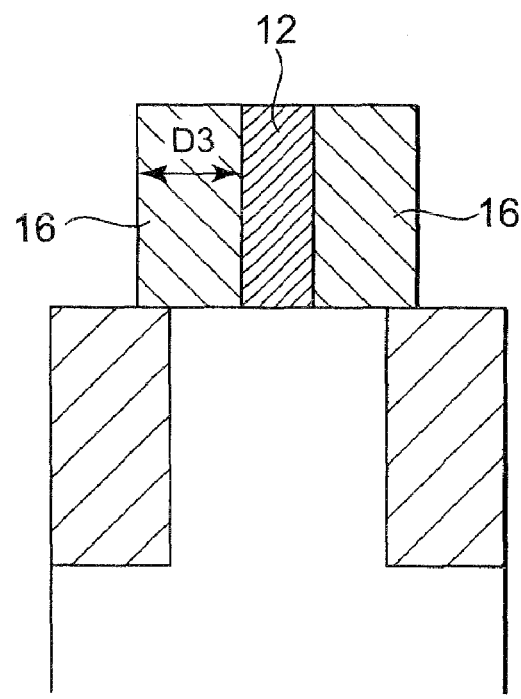
FIG. 10 is a sectional view for describing a following step following the step of FIG. 8.
Figure 11:
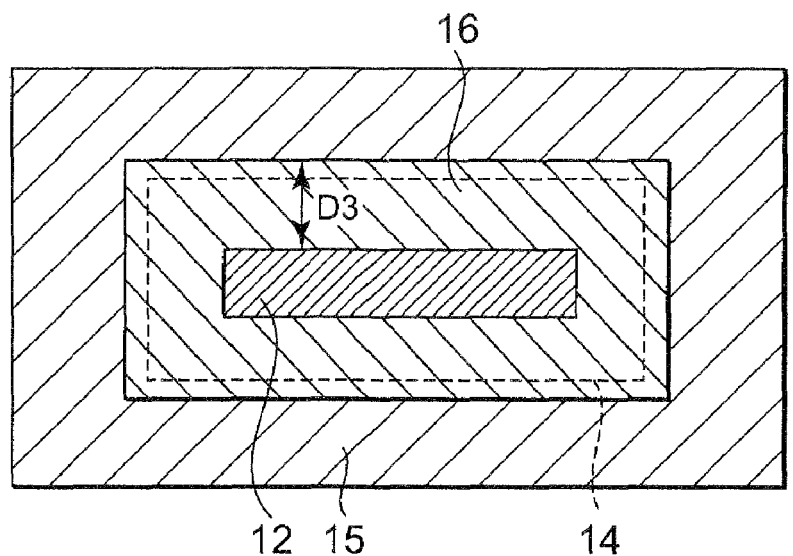
FIG. 11 is a plane view corresponding to FIG. 10.

Next, a third dielectric film (e.g. an oxide film) is formed on an entire surface. The third dielectric film has an etching selectivity to the first dielectric film 12 on an occasion of dry or wet etching. Then, the third dielectric film is etched by dry etching (anisotropic etching) to form a side wall 16 having width of D3 (>D2) as shown in FIG. 10. FIG. 11 is a plane view corresponding to FIG. 10.

Next, the first dielectric film 12 is removed by wet etching. In this event, the second and the third dielectric film are hardly etched because they have an etching selectivity to the first dielectric film 12. Consequently, only the first dielectric film 12 is practically removed and the diffusion layer 14 is exposed at only a region surrounded by the side wall 16.

Figure 12:
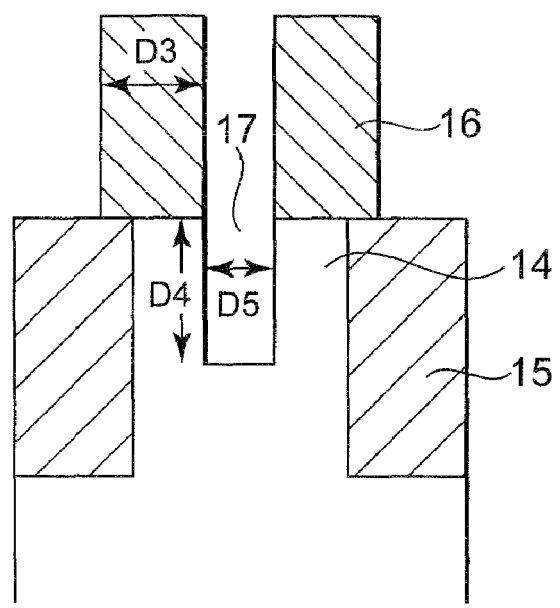
FIG. 12 is a sectional view for describing a following step following the step of FIG. 10.
Figure 13:
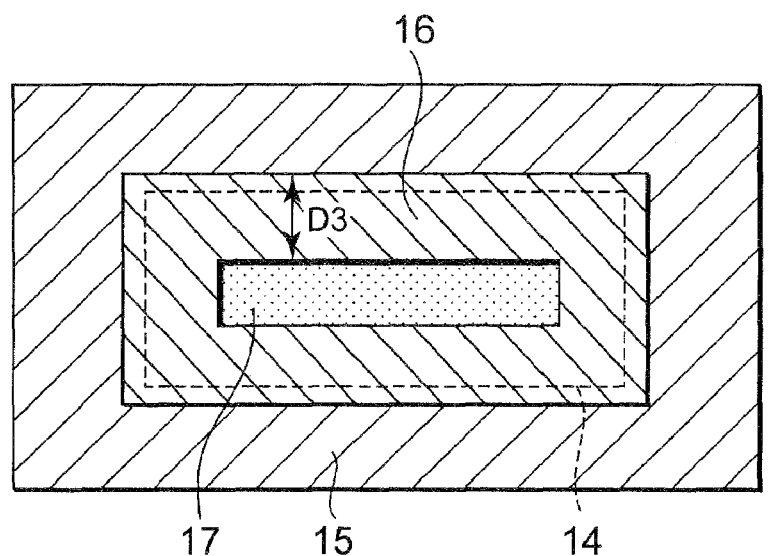
FIG. 13 is a plane view corresponding to FIG. 12.

Next, as illustrated in FIG. 12, using the side wall 16 as an etching mask, the diffusion layer 14 is etched by dry etching at an exposed region surrounded by the side wall 16. Due to the dry etching, a trench 17 having depth D4 is formed in the central region of the diffusion layer 14. FIG. 13 is a plane view corresponding to FIG. 12.

Figure 14:
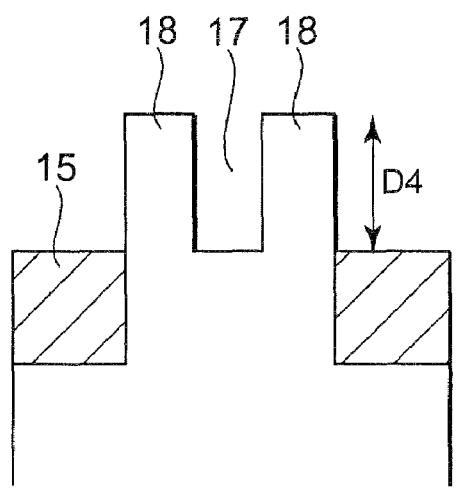
FIG. 14 is a sectional view for describing a following step following the step of FIG. 12.
Figure 15:
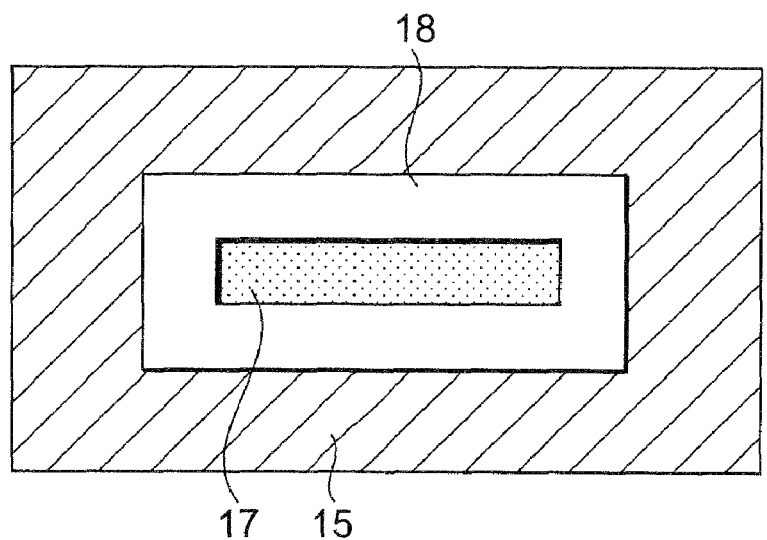
FIG. 15 is a plane view corresponding to FIG. 14.

After that, the side wall 16 is removed by wet etching or the like. Subsequently, as illustrated in FIG. 14, a part corresponding to thickness D4 of the second dielectric film 15 is removed by wet etching or the like. Hereby, the surface of the second dielectric film 15 is aligned with the bottom of the trench 17. Thus, fins 18 having height equal to D4 are formed. FIG. 15 is a plane view corresponding to FIG. 14.

Figure 16:
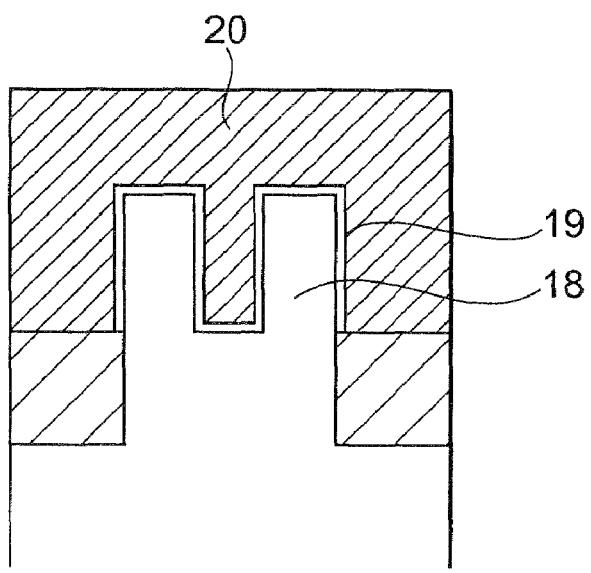
FIG. 16 is a sectional view for describing a following step following the step of FIG. 14.
Figure 17:
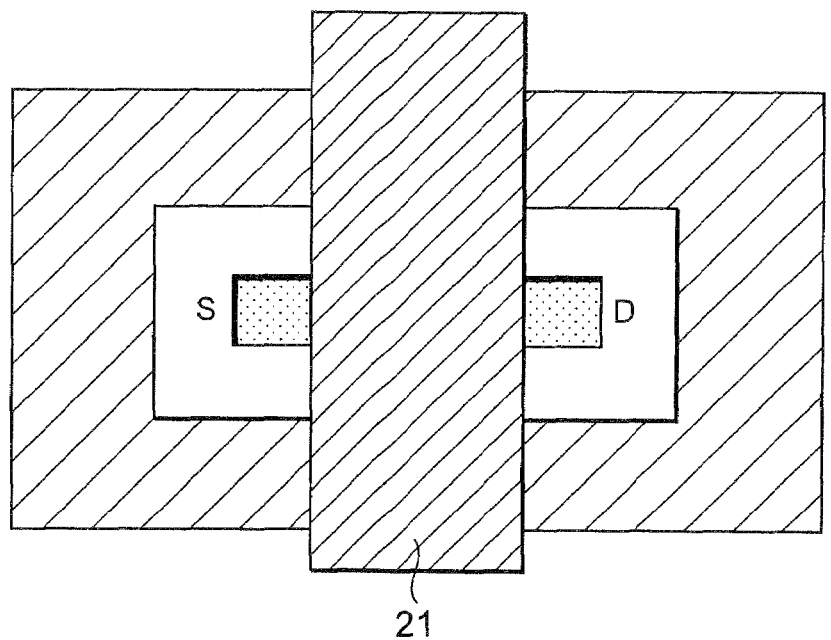
FIG. 17 is a plane view corresponding to FIG. 16.

Next, as illustrated in FIG. 16, by thermal oxidation or the like, a gate oxide film 19 is formed on an exposed surface of the diffusion layer 14 in which the trench 17 is formed. A gate electrode film 20 is formed on an entire surface including the surface of the gate oxide film 19. Then, the gate electrode film 20 is etched into a predetermined shape by means of photolithography and dry etching and so on to form a gate electrode 21 which extends along a direction perpendicular to the longitudinal direction of the diffusion layer as illustrated in FIG. 17.

Figure 18:
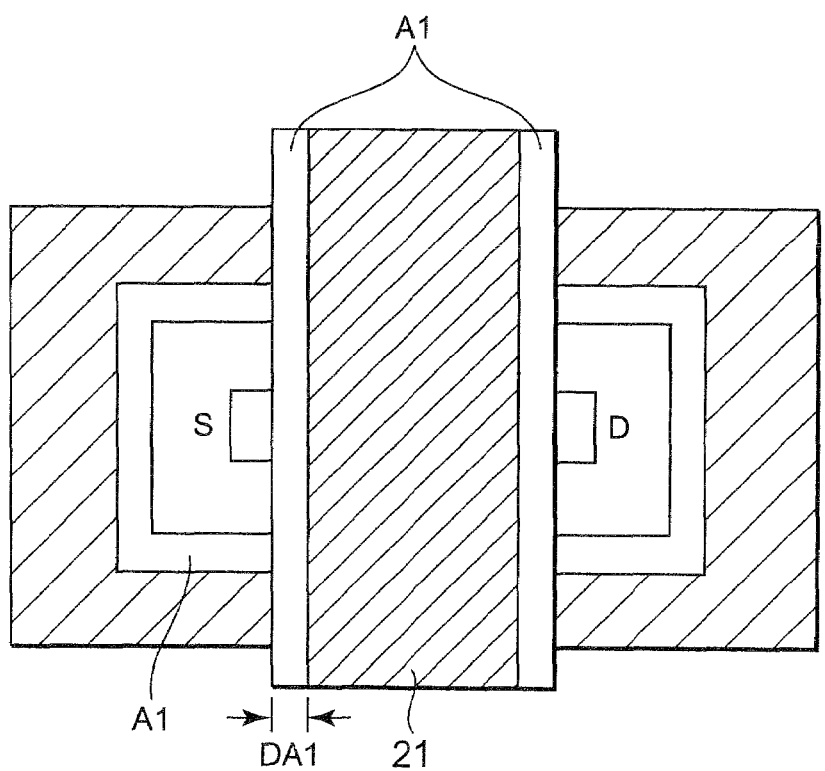
FIG. 18 is a sectional view for describing a following step following the step of FIG. 16.

Next, a fourth dielectric film (e.g. a nitride film) having a thickness of DA1 is formed on an entire surface. Here, the thickness DA1 is larger than a half of the width D1 and thereby spaces (or the trench 17), which are exposed at source and drain regions of the diffusion layer 14, of the inside of fin portions are filled by the fourth dielectric film. Then, dry etching is executed to the fourth dielectric film to form side walls A1 on side surfaces of the gate electrode 21 and the diffusion layer 14 as shown in FIG. 18.

Figure 19:
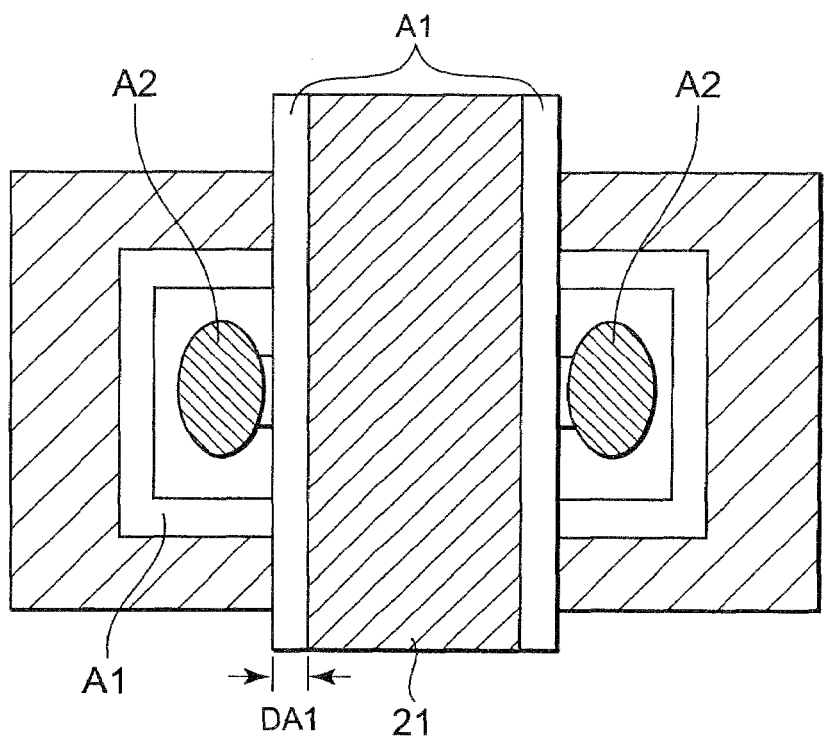
FIG. 19 is a plane view corresponding to FIG. 18.

Next, as illustrated in FIG. 19, source and drain contacts A2 are formed. Here, parts, which are located at both sides of the gate electrode 21 and are different from other parts embedded by the forth dielectric film, of the diffusion layer 14 are used as a source S and a drain D.

The parts, which are at the both sides of the gate electrode 21, of the diffusion layer 14 are used as the source S and the drain D while other parts, which are located under the gate electrode 21, of the fins 18 are used as channel portions or a multi channel fin.

In this embodiment, the length of the trench 17 (in horizontal direction of FIG. 17) is larger than the width of the gate electrode 21 to make removal of unnecessary parts of the gate electrode film 20 in the trench 17 easy. In view of displacement of the gate electrode at formation, the length of the trench 17 is 40 nm or more larger than the width of the gate electrode 21.

As mentioned above, according to this embodiment, a semiconductor device (or a transistor) can be manufactured. The method of this embodiment is simplified in comparison with the related method because it needs a single photolithography process and a single planarization process to form the multi channel structure.

Furthermore, according to this embodiment, an interval of trenches can be reduced without limitation caused by resolution of the photolithography. This is because a mask for defining an element region is reduced in size and side walls are formed on side surfaces of the reduced mask and then the side walls are used to form the trenches. Likewise, the width of each trench can be reduced because of the same reason mentioned above.

In addition, according to this embodiment, response characteristics (electric characteristics) of the semiconductor device are stable and superior because current paths are caused only within the fin portions.

Next, the description will be made about a second embodiment of the invention referring to FIGS. 20 to 31. In each drawing, the similar parts are designated by the same reference numbers.

Though the first embodiment is concerned with a manufacturing method of a two fin transistor having a pair of fins, the second embodiment is concerned with a manufacturing method of a four fin transistor having two pair of fins. Additionally, the manufacturing method according to the second embodiment is essentially similar to that according to the first embodiment.

At first, similarly as for the first embodiment, a first dielectric film is formed on a silicon substrate and then a photo resist film is formed on the first dielectric film. Next, the photo resist film is patterned into a pattern of two diffusion region patterns arranged in parallel to each other. Using the patterned photo resist film as an etching mask, the first dielectric film is etched. After the photo resist film is removed, the silicon substrate is etched by dry etching using the first dielectric film as an etching mask. Thus, two diffusion layers are formed in parallel to each other to leave a apace between them. After that, a second dielectric film is formed to fill periphery of the diffusion layers. The second dielectric film is etched so that the surface of the second dielectric film is aligned with the upper surface of the silicon substrate. Then, the first dielectric film is reduced in size.

Figure 20:
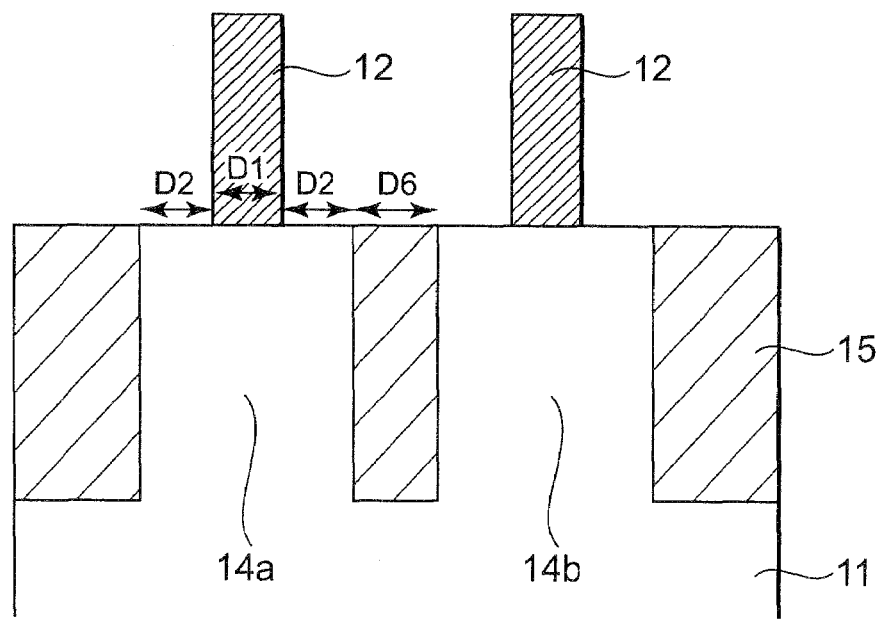
FIG. 20 is a sectional view for describing a manufacturing method of a semiconductor device according to a second embodiment of this invention.
Figure 21:
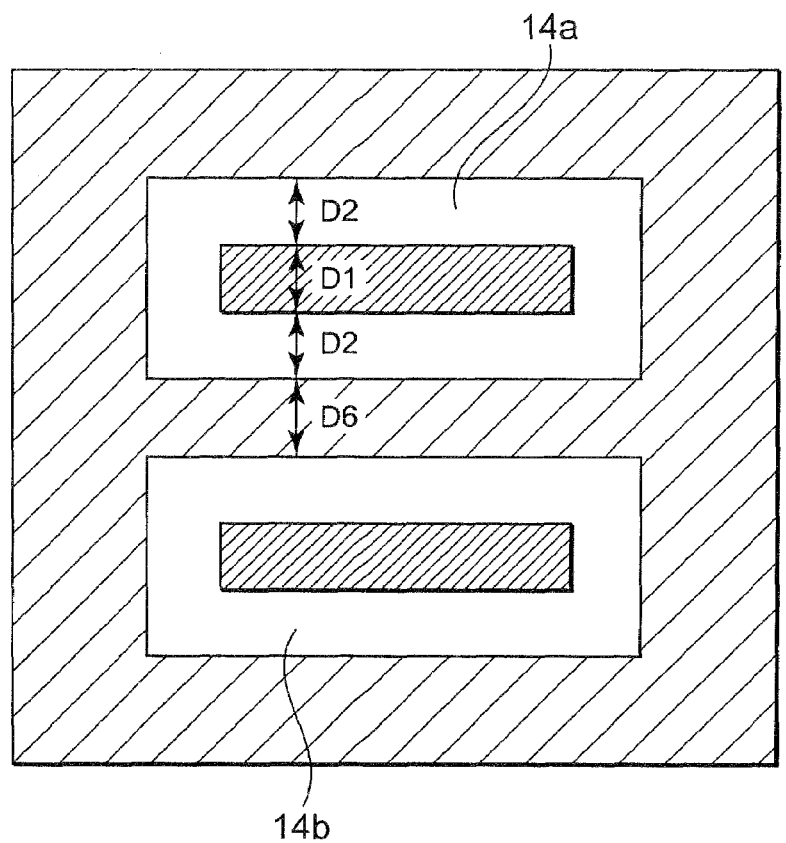
FIG. 21 is a plane view corresponding to FIG. 20.

According to the above mentioned processes, a state as illustrated in FIG. 20 is obtained. FIG. 21 is a plane view corresponding to the FIG. 20. FIGS. 20 and 21 correspond to FIGS. 8 and 9 of the first embodiment.

As shown in FIGS. 20 and 21, the distance between the two diffusion layers 14a and 14b are equal to D6. It is preferable that the distance D6 has a value close to the distance D2. It is further preferable that the distance D6 equal to the distance D2.

Figure 22:
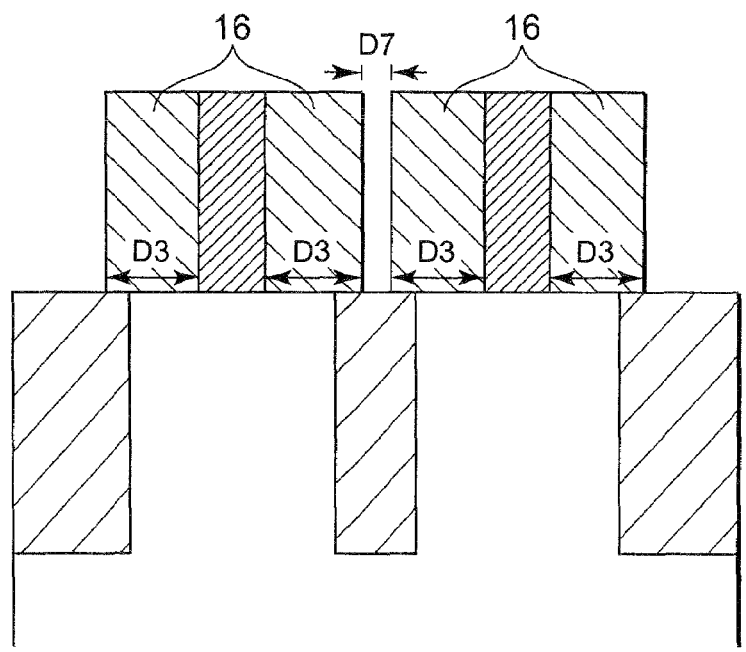
FIG. 22 is a sectional view for describing a following step following the step of FIG. 20.
Figure 23:
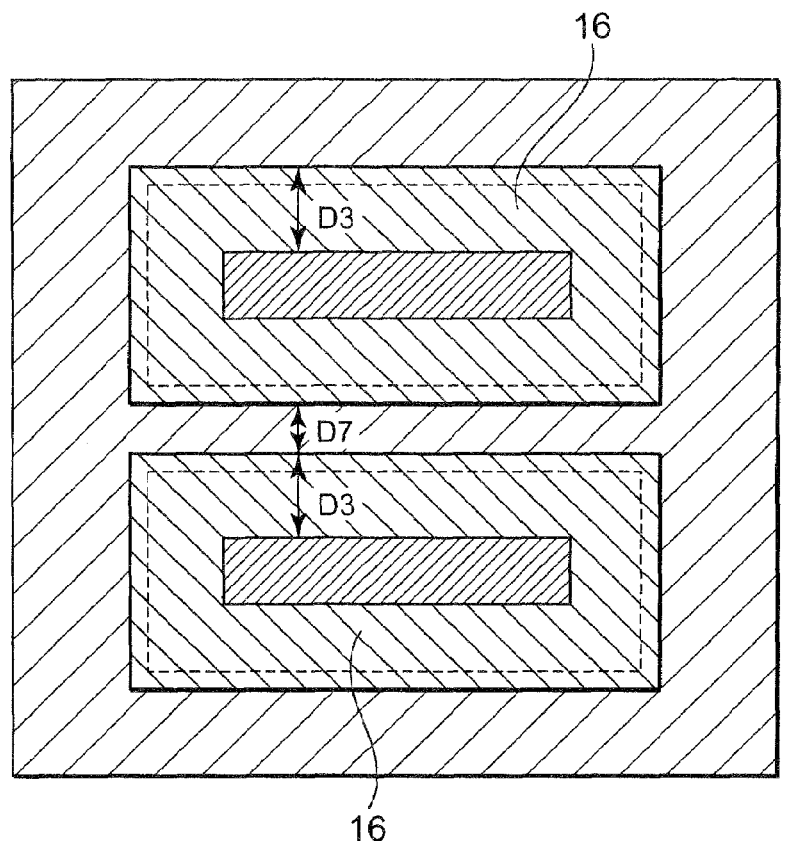
FIG. 23 is a plane view corresponding to FIG. 22.

Next, as illustrated in FIGS. 22 and 23, side walls 16 having a width of D3 (>D2) is formed on side surfaces of the first film 12 by using a third dielectric film having an etching selectivity to the first dielectric film 12 on an occasion of dry and wet etching. Here, a distance D7 (=D6+2×D2−2×D3) between the side walls 16 on the adjacent diffusion layers 14a and 14b may be equal to zero.

Figure 24:
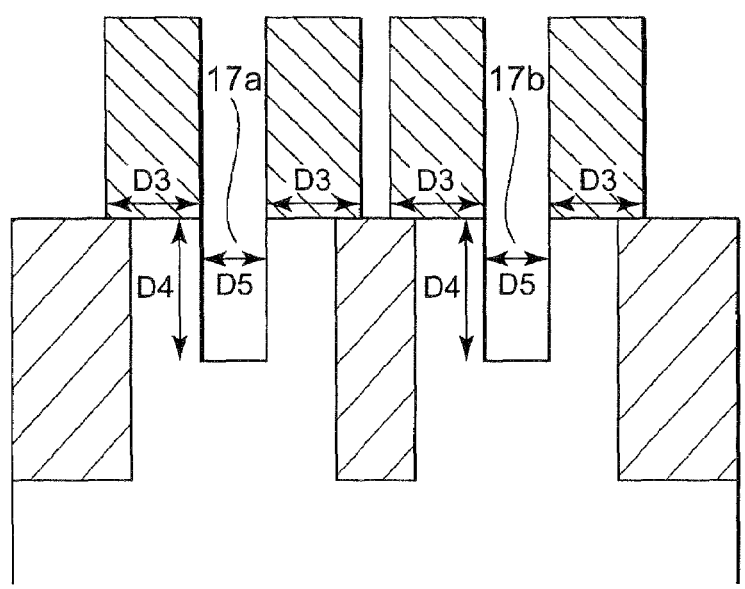
FIG. 24 is a sectional view for describing a following step following the step of FIG. 22.
Figure 25:
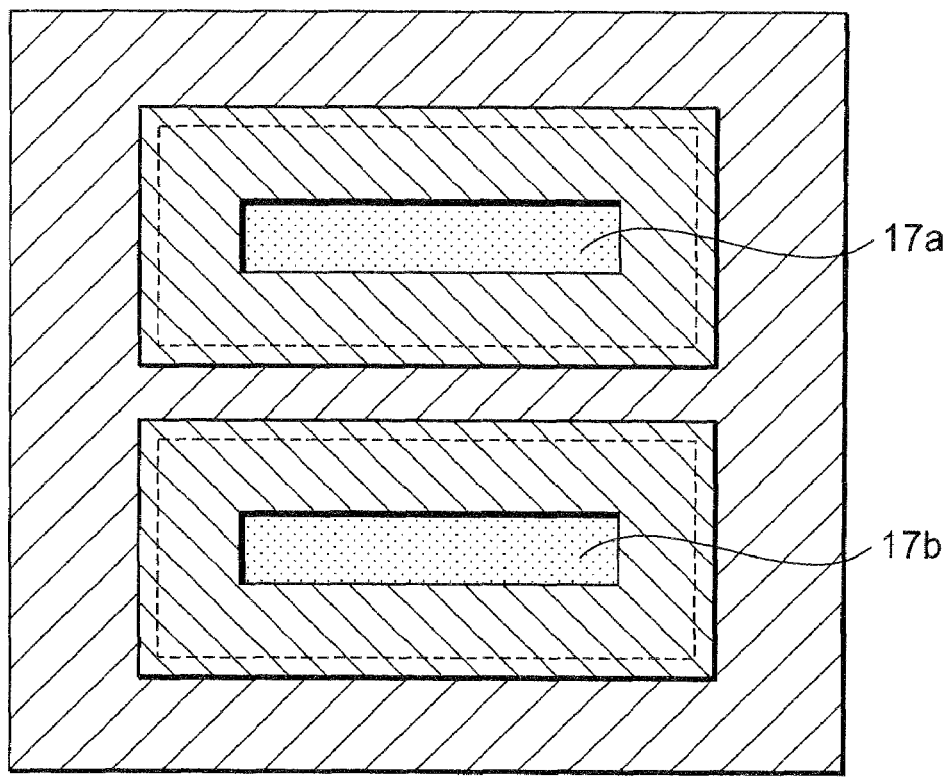
FIG. 25 is a plane view corresponding to FIG. 24.

Then, similar as for the first embodiment, wet etching is executed to the first dielectric film 12 to remove it. Using the side walls 16 made of the third dielectric film as etching masks, dry etching is executed to the diffusion layers 14a and 14b to form trenches 17a and 17b having depth D4 as shown in FIG. 24. FIG. 25 is plane view corresponding to FIG. 24.

Figure 26:
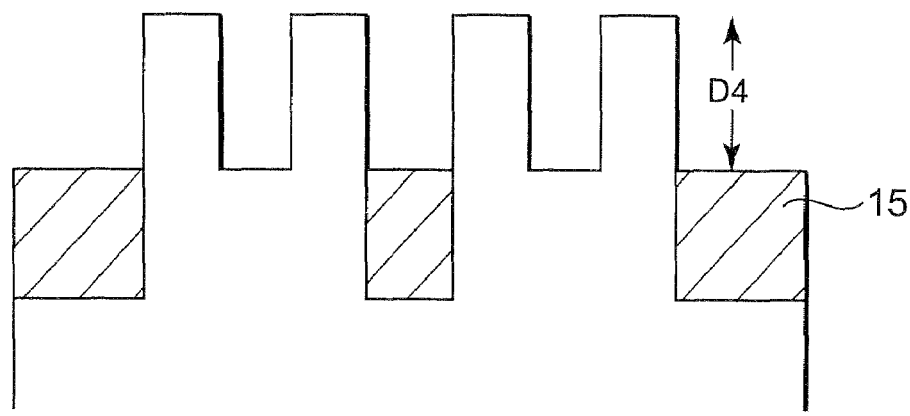
FIG. 26 is a sectional view for describing a following step following the step of FIG. 24.
Figure 27:
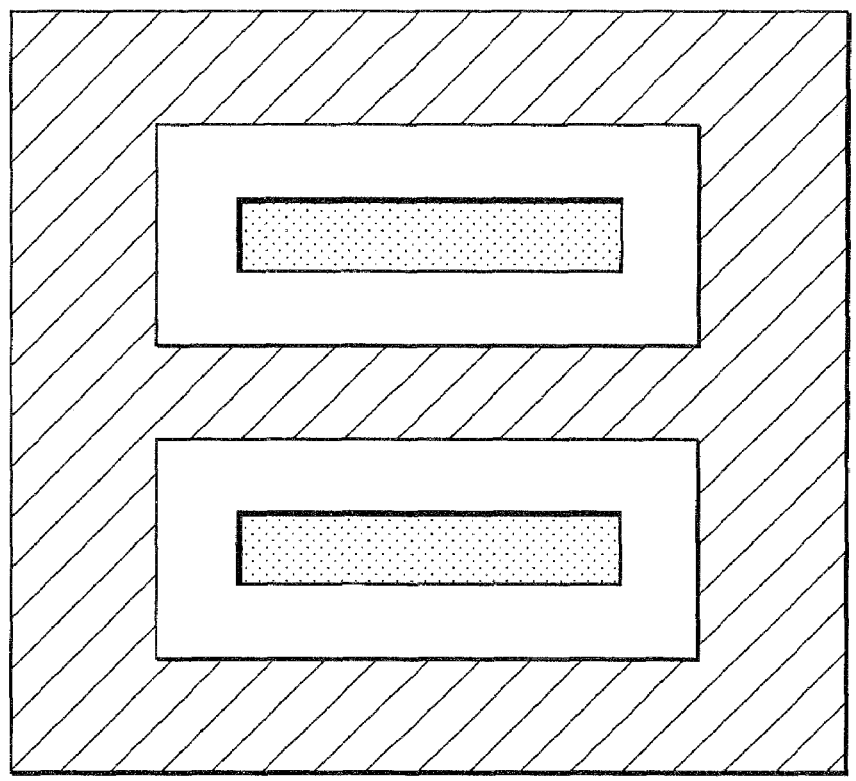
FIG. 27 is a plane view corresponding to FIG. 26.

Next, the side walls 16 are removed by wet etching or the like. A part corresponding to thickness D4 of the second dielectric film 15 is removed by wet etching or the like to align the second dielectric film 15 with a bottom of the trenches 17a and 17b as shown in FIG. 26. FIG. 27 is a plane view corresponding to FIG. 26.

Figure 28:
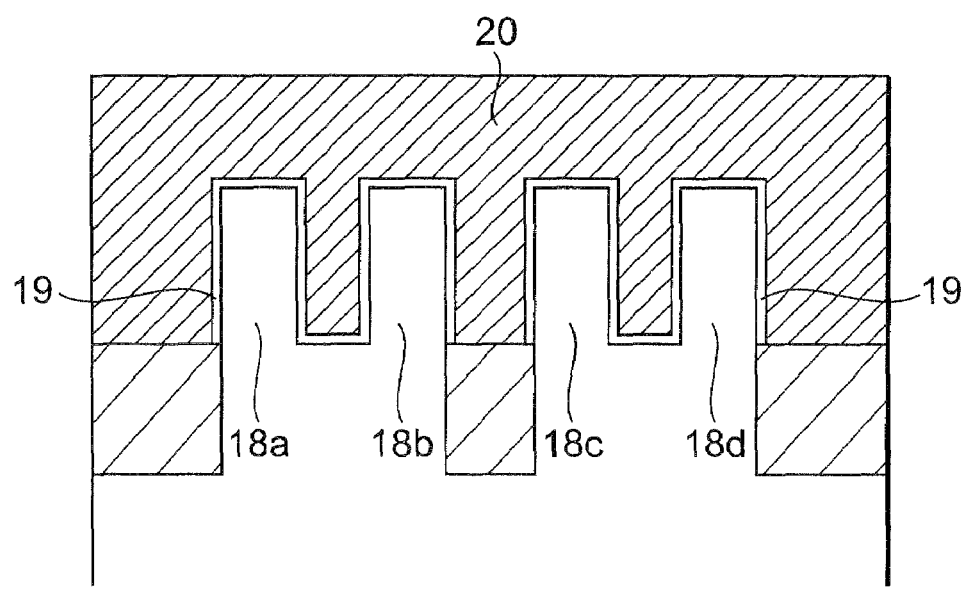
FIG. 28 is a sectional view for describing a following step following the step of FIG. 26.
Figure 29:
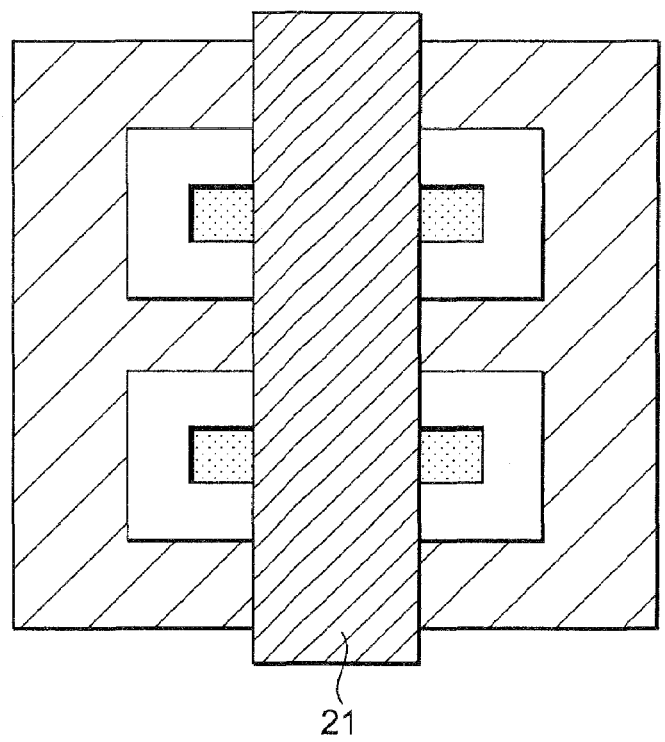
FIG. 29 is a plane view corresponding to FIG. 28.

After that, as illustrated in FIG. 28, a gate oxide film 19 is formed by thermal oxidation or the like and a gate electrode film 20 is formed on an entire surface including the surface of the gate oxide film 19. The gate electrode film 20 is etched into a predetermined shape by photolithography and dray etching and so on to form a gate electrode 21 as shown in FIG. 29.

Figure 30:
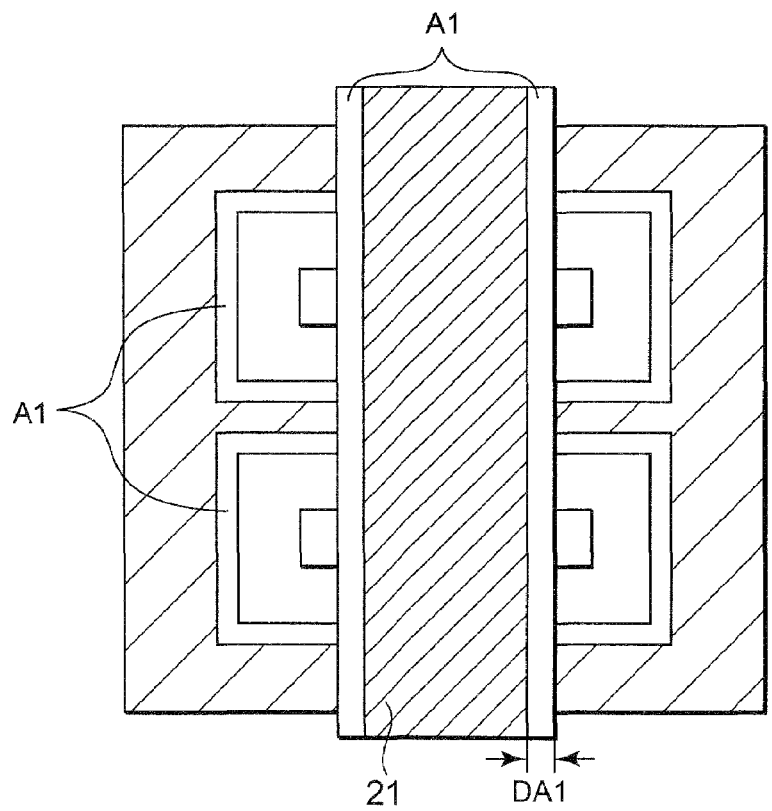
FIG. 30 is a sectional view for describing a following step following the step of FIG. 28.

Next, a fourth dielectric film (e.g. a nitride film) having a thickness of DA1 is formed on an entire surface. Here, the thickness DA1 is larger than a half of the width D1 and thereby spaces (or the trenches 17a and 17b), which are exposed at source and drain regions of the diffusion layers 14a and 14b, of the inside of fin portions are filled with the fourth dielectric film. Then, dry etching is executed to the fourth dielectric film to from side walls A1 on side surfaces of the gate electrode 21 and diffusion layers 14a and 14b as shown in FIG. 30.

Figure 31:
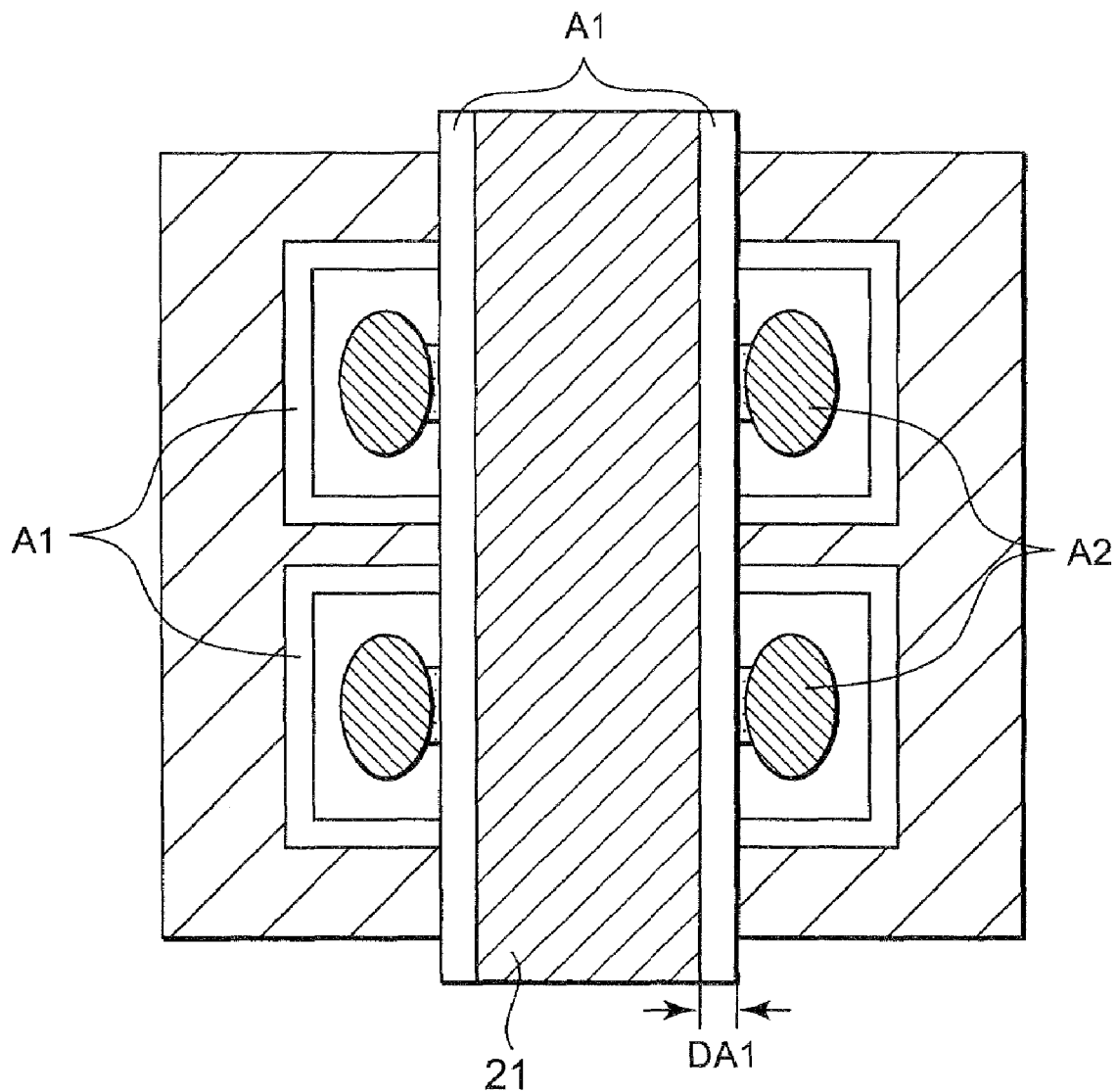
FIG. 31 is a sectional view for describing a following step following the step of FIG. 30.

Next, as illustrated in FIG. 31, source and drain contacts A2 are formed. Here, parts, which are located at both sides of the gate electrode 21 and are different from other parts embedded by the fourth dielectric film, of the diffusion layers 14a and 14b are used as sources S and drains D.

As mentioned above, a multi channel fin structure having four fins 18a, 18b, 18c and 18d formed under the gate electrode 21 in parallel to one another can be obtained.

The method of this embodiment is also simplified in comparison with the related method because it needs a single photolithography process and a single planarization process to form the multi channel structure. Furthermore, according to this embodiment, interval and width of trenches can be reduced without limitation caused by resolution of the photolithography. In addition, according to this embodiment, response characteristics (electric characteristics) of the semiconductor device are stable and superior because current paths are caused only within the fin portions.

While this invention has thus far been described in conjunction with the preferred embodiments thereof, it will readily be possible for those skilled in the art to put this invention into practice in various other manners.

What is claimed is:

1. A method for manufacturing a semiconductor device, comprising:
    defining an element region by etching a semiconductor substrate using a first dielectric film as a mask;
    reducing the first dielectric film to form a reduced dielectric film;
    covering the reduced dielectric film with a second dielectric film different from the first dielectric film, the second dielectric film including a first portion over an upper surface of the reduced dielectric film and a second portion surrounding a side surface of the reduced dielectric film;
    etching back the second dielectric film to remove the first portion and leave the second portion;
    removing the reduced dielectric film while leaving the second portion; and
    forming a trench in the element region by using the second portion as a mask to form a plurality of fin portions.

2. The method claimed in claim 1, further comprising:
    embedding the element region with a third dielectric film after the defining step;
    planarizing the third dielectric film; and
    aligning a surface of the third dielectric film with a surface of the element region.

3. The method claimed in claim 2, further comprising:
    removing the second portion; and
    aligning the surface of the third dielectric film with a bottom of the trench.

4. A method for manufacturing a semiconductor device, comprising:
    defining an element region by etching a semiconductor substrate using a first dielectric film as a mask;
    reducing the first dielectric film to form a reduced dielectric film;
    covering the reduced dielectric film with a second dielectric film different from the first dielectric film, the second dielectric film including a first portion over an upper surface of the reduced dielectric film and a second portion surrounding a side surface of the reduced dielectric film;
    etching back the second dielectric film to remove the first portion and leave the second portion;
    removing the reduced dielectric film while leaving the second portion;
    forming a trench in the element region by using the second portion as a mask to form a plurality of fin portions;
    the trench including a center portion and third and fourth portions sandwiching the center portion therebetween; and
    filling a gate electrode in the center portion of the trench while leaving each of the third and fourth portions of the trench unfilled with the gate electrode.

5. The method claimed in claim 4, further comprising:
    embedding the element region with a third dielectric film after the defining;
    planarizing the third dielectric film; and
    aligning a surface of the third dielectric film with a surface of the element region.

6. The method claimed in claim 5, further comprising:
    removing the second portion; and
    aligning the surface of the third dielectric film with a bottom of the trench.

* * * * *